US010373688B2

(12) United States Patent
Georgescu et al.

(10) Patent No.: US 10,373,688 B2
(45) Date of Patent: *Aug. 6, 2019

(54) HIGH VOLTAGE ARCHITECTURE FOR NON-VOLATILE MEMORY

(71) Applicant: Cypress Semiconductor Corporation, San Jose, CA (US)

(72) Inventors: Bogdan I. Georgescu, Colorado Springs, CO (US); Gary P. Moscaluk, Colorado Springs, CO (US); Vijay Raghavan, Colorado Springs, CO (US); Igor G. Kouznetsov, San Francisco, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/634,032

(22) Filed: Jun. 27, 2017

(65) Prior Publication Data

US 2017/0365346 A1   Dec. 21, 2017

Related U.S. Application Data

(63) Continuation of application No. 14/858,886, filed on Sep. 18, 2015, now Pat. No. 9,704,585.

(Continued)

(51) Int. Cl.
*G11C 16/14*  (2006.01)
*H01L 31/113*  (2006.01)

(Continued)

(52) U.S. Cl.
CPC .............. *G11C 16/14* (2013.01); *G11C 7/18* (2013.01); *G11C 8/08* (2013.01); *G11C 16/0433* (2013.01);

(Continued)

(58) Field of Classification Search
None
See application file for complete search history.

(56) References Cited

U.S. PATENT DOCUMENTS 6,072,722 A   6/2000   Hirano
6,163,048 A   12/2000  Hirose et al.

(Continued)

FOREIGN PATENT DOCUMENTS

EP    0756286 B1    1/2000

OTHER PUBLICATIONS

"Flash memory basics and its interface to a processor", Online course on Embedded Systems, Module 14, accessed from EEHerald <http://www.eeherald.com/section/design-guide/esmod16.html>; 7 pages.

(Continued)

*Primary Examiner* — James G Norman
(74) *Attorney, Agent, or Firm* — Kunzler Bean & Adamson

(57) ABSTRACT

A method of erasing, during an erase operation, a non-volatile memory (NVM) cell of a memory device is disclosed. The erasing includes applying a first HV signal (VPOS) to a common source line (CSL). The CSL is shared among NVM cells of a sector of NVM cells. The first HV signal is above a highest voltage of a power supply. The erasing also includes applying the first HV signal to a local bit line (BL).

18 Claims, 13 Drawing Sheets

Related U.S. Application Data

(60) Provisional application No. 62/175,917, filed on Jun. 15, 2015.

(51) Int. Cl.

| | | |
|---|---|---|
| *G11C 7/18* | (2006.01) | |
| *G11C 8/08* | (2006.01) | |
| *G11C 16/04* | (2006.01) | |
| *G11C 16/08* | (2006.01) | |
| *G11C 16/10* | (2006.01) | |
| *G11C 16/16* | (2006.01) | |
| *G11C 16/26* | (2006.01) | |
| *G11C 16/30* | (2006.01) | |

(52) U.S. Cl.
CPC .............. *G11C 16/08* (2013.01); *G11C 16/10* (2013.01); *G11C 16/16* (2013.01); *G11C 16/26* (2013.01); *G11C 16/30* (2013.01); *H01L 31/113* (2013.01)

(56) References Cited

U.S. PATENT DOCUMENTS

| | | | |
|---|---|---|---|
| 7,031,210 B2 | 4/2006 | Park et al. | |
| 7,495,960 B2 | 2/2009 | Chih et al. | |
| 7,986,573 B2 | 7/2011 | Li | |
| 8,315,083 B2 | 11/2012 | Wang et al. | |
| 8,570,809 B2 | 10/2013 | Hirose et al. | |
| 8,953,380 B1 | 2/2015 | Yu et al. | |
| 2004/0062132 A1 | 4/2004 | Pascucci | |
| 2006/0250854 A1 | 11/2006 | Lee et al. | |
| 2007/0174641 A1 | 7/2007 | Cornwell et al. | |
| 2010/0074028 A1* | 3/2010 | Hirose .................. G11C 5/145 365/185.29 |
| 2011/0267874 A1 | 11/2011 | Ryu et al. | |
| 2013/0141978 A1 | 6/2013 | Hirose et al. | |
| 2014/0269075 A1 | 9/2014 | Duuren et al. | |

OTHER PUBLICATIONS

International Search Report for International Application No. PCT/US16/14581 dated Apr. 11, 2016; 2 pages.
Liyan Jin et al., "Design of DC-DC Converter for Flash Memory IPs", Department of electronic engineering, Chanwon National University, Changwon, South Korea; published Jan. 2013; 4 pages.
USPTO Applicant Initiated Interview Summary for U.S. Appl. No. 14/858,886 dated Nov. 21, 2016; 3 pages.
USPTO Final Rejection for U.S. Appl. No. 14/858,886 dated Dec. 20, 2016; 15 pages.
USPTO Non-Final Rejection for U.S. Appl. No. 14/858,886 dated Sep. 16, 2016; 12 pages.
USPTO Notice of Allowance for U.S. Appl. No. 14/858,886 dated Mar. 10, 2017; 8 pages.
Written Opinion of the International Searching Authority for International Application No. PCT/US16/14581 dated Jun. 21, 2016; 7 pages.

* cited by examiner

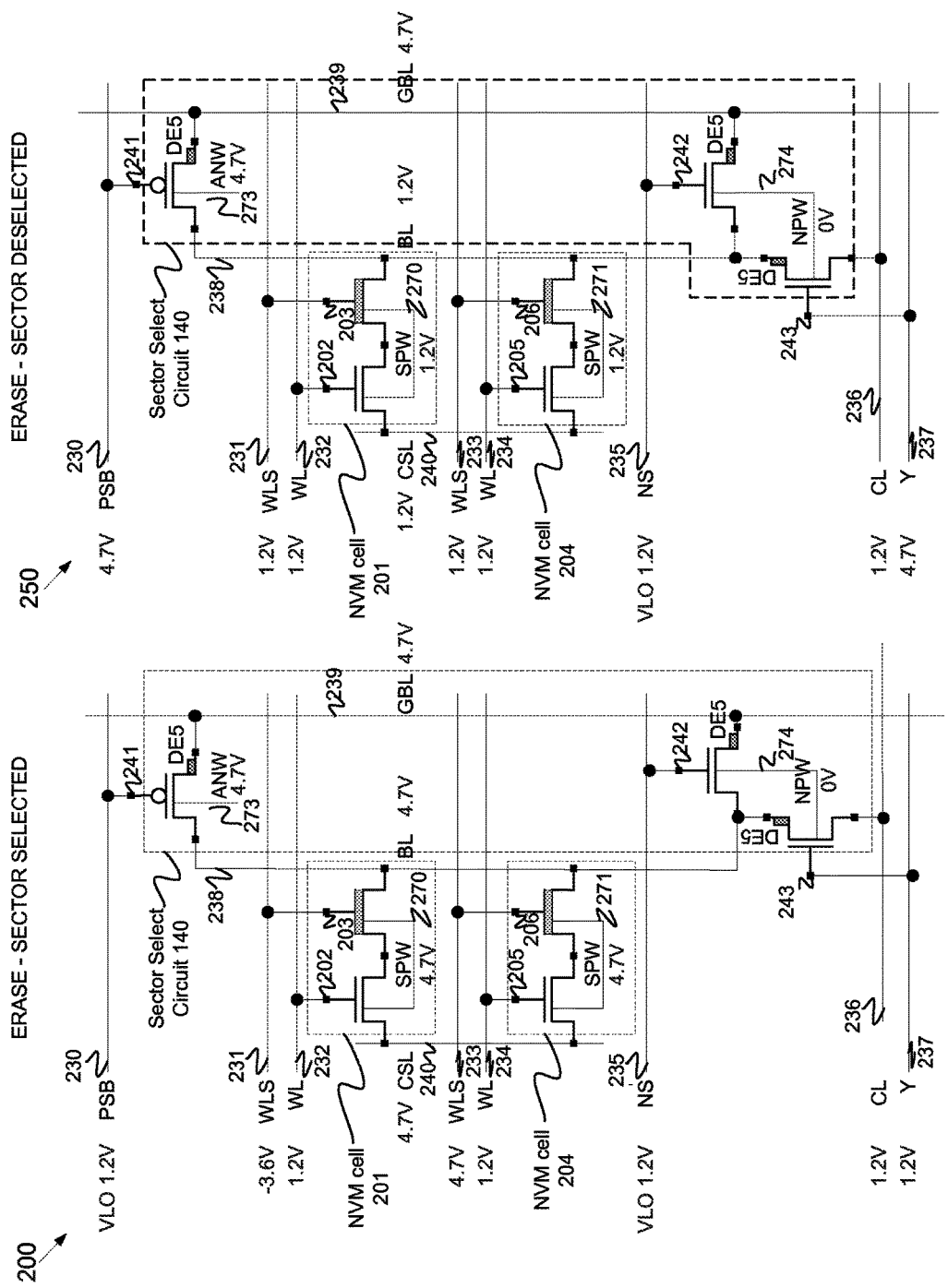

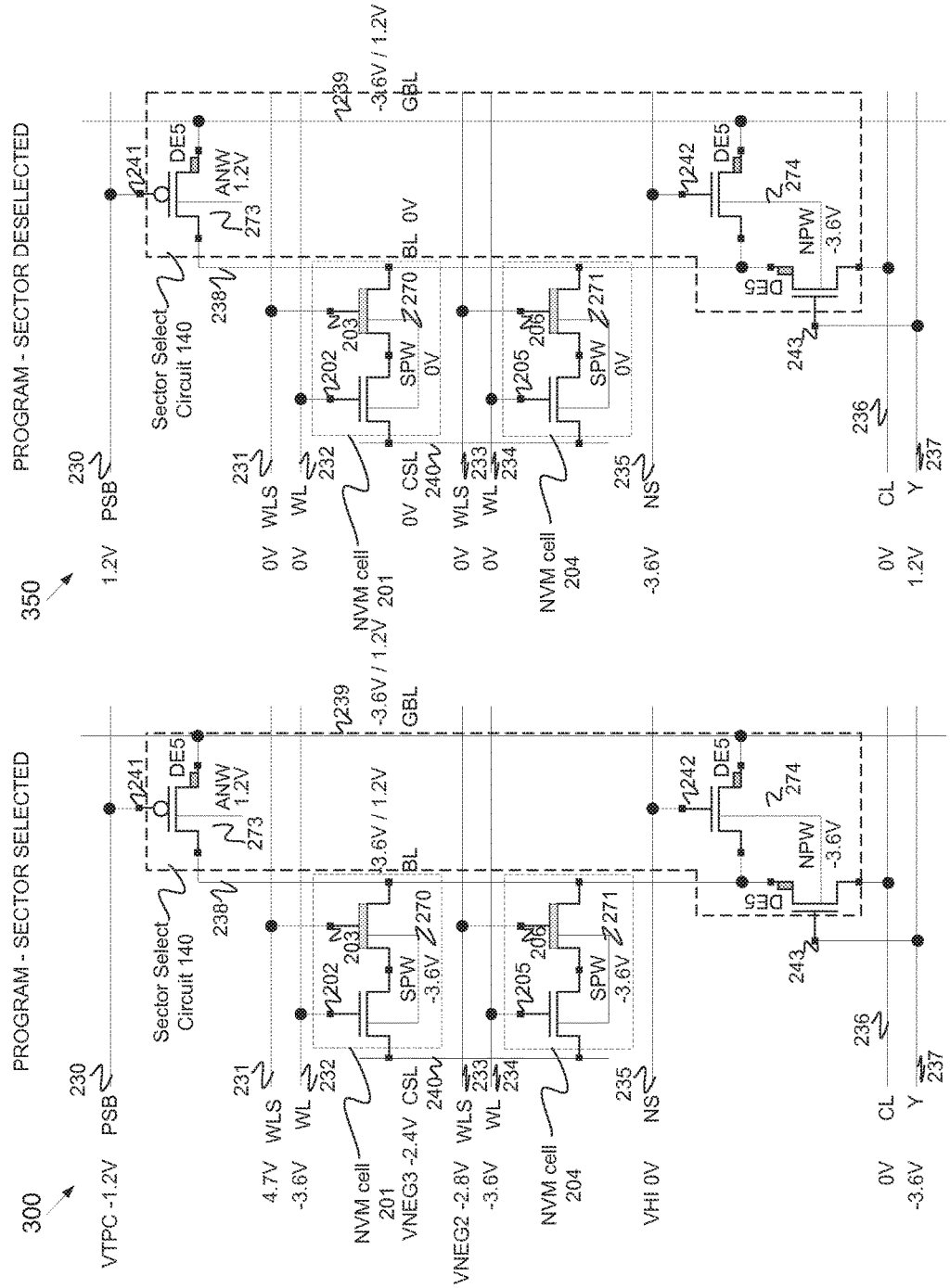

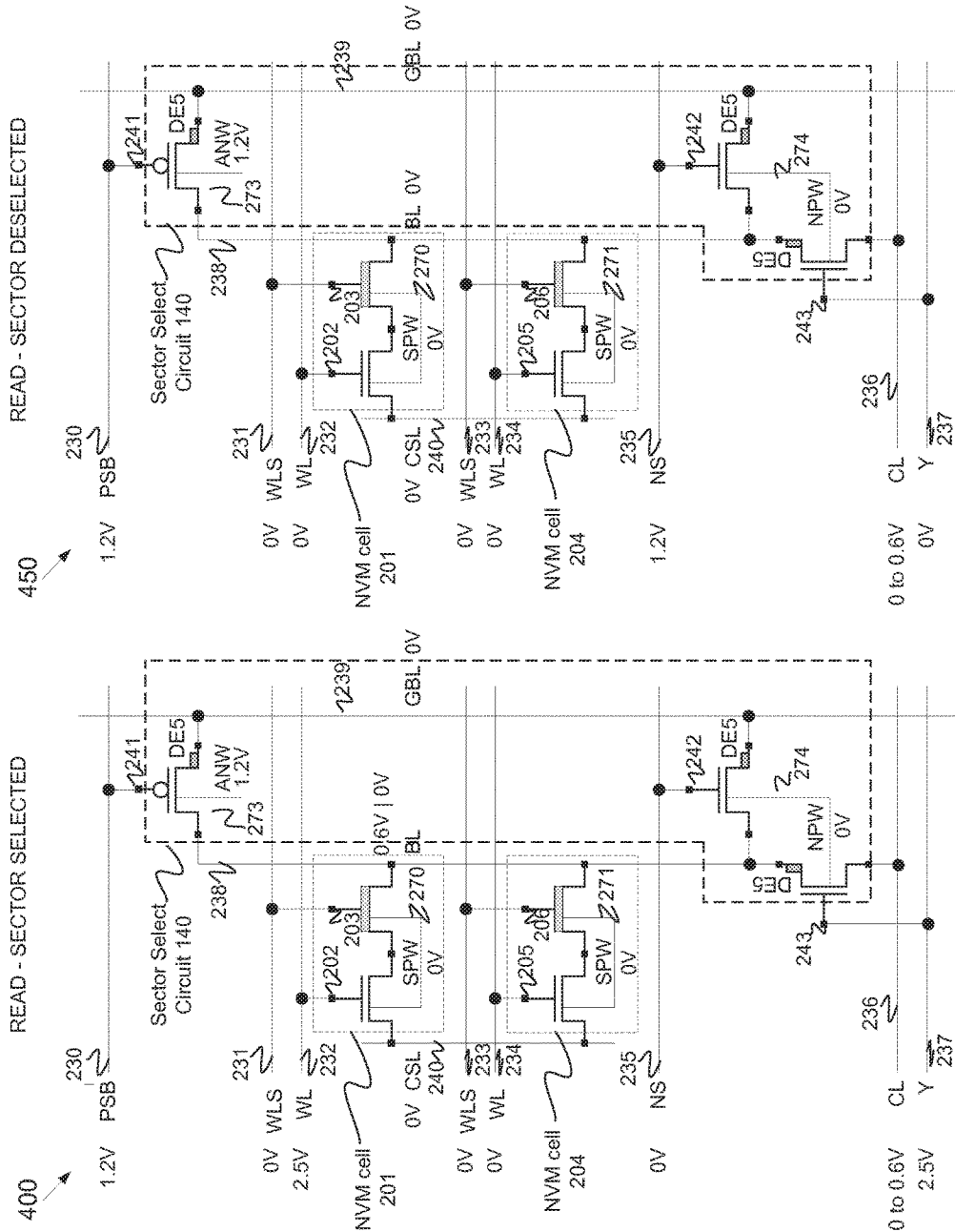

500

501 — Row-based signals for non-volatile memory (NVM) using common source line (CSL) architecture

| Line | Erase Operation | | | Program Operation | | | Read Operation | | |
|---|---|---|---|---|---|---|---|---|---|
| | sel sect | | desel sect | sel sect | | desel sect | sel sect | | desel sect |
| | sel row | desel row | | sel row | desel row | | sel row | desel row | |
| WLS | VNEG | VNEG | Vpwr | VPOS | VNEG2 | Vgnd | Vgnd | Vgnd | Vgnd |
| CSL | VPOS | VPOS | Vpwr | VNEG3 | VNEG3 | Vgnd | Vgnd | Vgnd | Vgnd |
| SPW | VPOS | VPOS | Vpwr | VNEG | VNEG | Vgnd | Vgnd | Vgnd | Vgnd |
| WL | Vpwr | Vpwr | Vpwr | VNEG | VNEG | Vgnd | VBST | Vgnd | Vgnd |
| CL | Vpwr | Vpwr | Vpwr | Vgnd | Vgnd | VNEG | VLIM | VLIM | VLIM |
| NS | VLO | VLO | VLO | VHI | VHI | VHI | Vgnd | Vgnd | Vgnd |
| PSB | VLO | VLO | VPOS | VTPC | VTPC | vbl | Vpwr | Vpwr | Vpwr |
| ARW | VPOS | VPOS | VPOS | vbl | vbl | vbl | Vpwr | Vpwr | Vpwr |

502 — Column-based signals for non-volatile memory (NVM) using common source line (CSL) architecture

| Line | Erase Operation | | Program Operation | | | Read Operation | | |
|---|---|---|---|---|---|---|---|---|
| | sel sect | desel sect | sel sect | | desel sect | sel sect | | desel sect |
| | | | Program | Inhibit | | sel column | desel column | |
| BL | VPOS | Vpwr | VNEG | VBL | Vgnd | VLIM | Vgnd | Vgnd |
| GBL | VPOS | VPOS | VNEG | VBL | VNEG/VBL | Vgnd | Vgnd | Vgnd |
| Y | Vpwr | VPOS | VNEG | VNEG | Vpwr | VBST | Vgnd | Vgnd |

503 — Voltage range of signals

| VBST | VPOS | VTPC | vbl | Vpwr | VNEG | VNEG2 | VNEG3 | VLO | VHI |
|---|---|---|---|---|---|---|---|---|---|
| 2 to 3V | 3.0 to 4.7V | -1.8 to -1.1V | 0.5 to 1.2V | 0.9 to 1.32V | -3.84 to -2.44V | -3 to -2.4V | -2.8 to -2.1V | 0V/Vpwr | Vpwr/3V |

| VLIM |
|---|
| 0 to 0.6V |

HIGH VOLTAGE ARCHITECTURE FOR NON-VOLATILE MEMORY

RELATED APPLICATIONS

This application is a Continuation Application of U.S. Non Provisional application Ser. No. 14/858,886, which claims the benefit of U.S. Provisional Application No. 62/175,917, filed on Jun. 15, 2015, the contents of which are hereby incorporated by reference herein.

BACKGROUND

Non-volatile memory devices are currently in widespread use in electronic components that require the retention of information when electrical power is unavailable. Non-volatile memory devices may include read-only-memory (ROM), programmable-read-only memory (PROM), erasable-programmable-read-only memory (EPROM), and electrically-erasable-programmable-read-only-memory (EEPROM) devices. Some memory arrays utilize transistors and gate structures which may include a charge trapping layer. The charge trapping layer may be programmed to store data based on voltages applied to or received by the memory array.

BRIEF DESCRIPTION OF THE DRAWINGS

The present disclosure is illustrated by way of example, and not by way of limitation, in the figures of the accompanying drawings.

FIG. 2A illustrates a selected sector of a non-volatile memory array during an erase operation, according to one embodiment.

FIG. 2B illustrates a deselected sector of a non-volatile memory array during an erase operation, according to one embodiment.

FIG. 3A illustrates a selected sector of a non-volatile memory array during a program operation, according to one embodiment.

FIG. 3B illustrates a deselected sector of a non-volatile memory array during a program operation, according to another embodiment.

FIG. 4A illustrates a selected sector of a non-volatile memory array during a read operation, according to one embodiment.

FIG. 4B illustrates a deselected sector of a non-volatile memory array during a read operation, according to another embodiment.

FIG. 5 are tables illustrating voltage biases for erase, program, and read operations performed on a non-volatile memory device, according to one embodiment.

DETAILED DESCRIPTION

Figure 1:
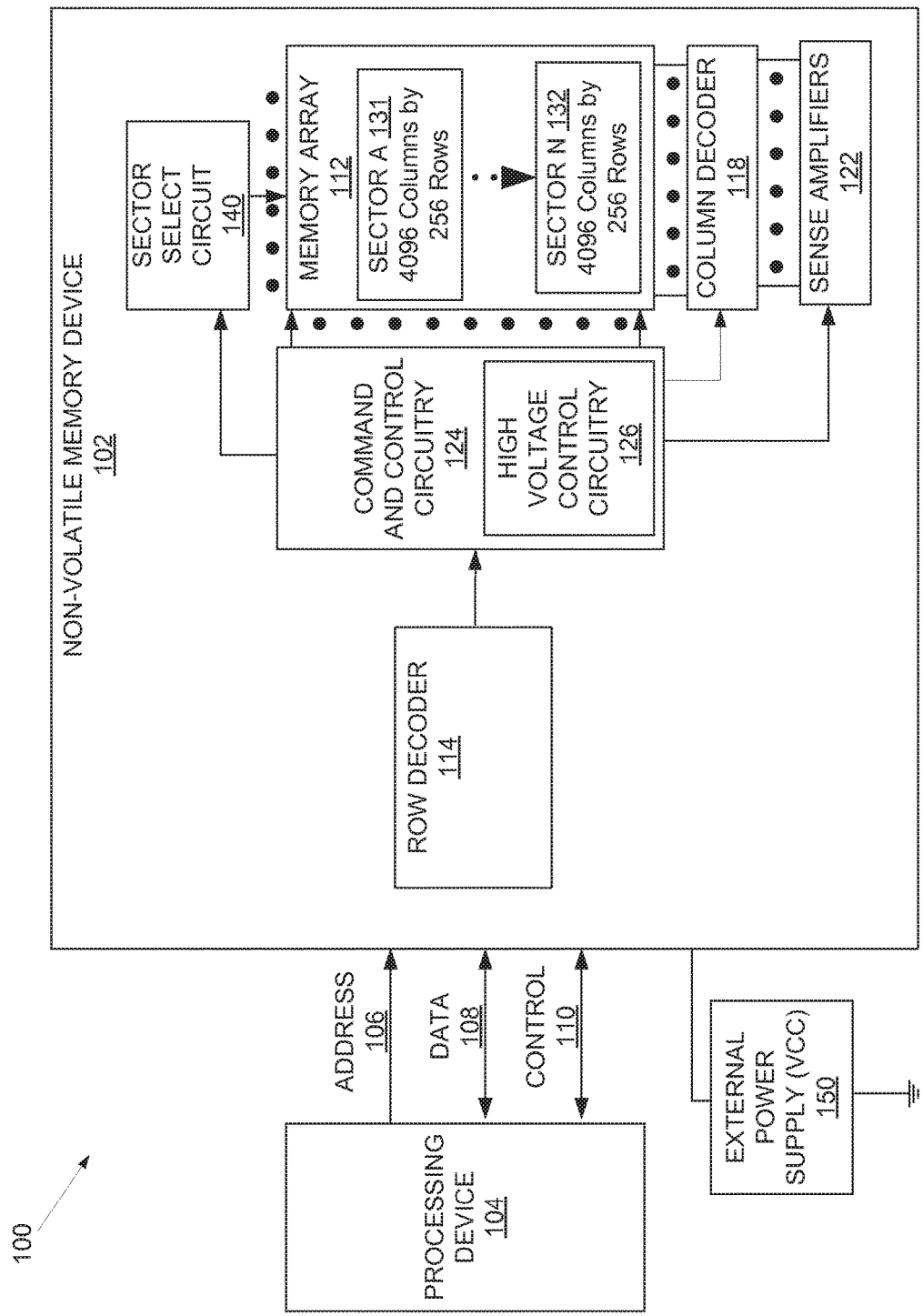
FIG. 1 is a block diagram illustrating a non-volatile memory system, according to an embodiment.

High voltage (HV) signals may be used in the operation of non-volatile memory (NVM) devices, such as flash memory or phase change memory. HV signals may be voltage signals that are above a highest voltage of a power supply of a NVM device or below a lowest voltage of a ground supply of a NVM device. For example, HV signals of 8.3 volts (V) may be required to program a NVM cell while the power supply of the NVM device ranges from 0V (e.g., lowest voltage) to 1.2V (e.g., highest voltage). HV signals applied to some transistors in a NVM device may cause those transistors to operate outside a safe operating area (SOA) which, in turn, may result in damage to the transistors and the NVM device. Safe operating area may be defined by a set of voltage differentials between the different terminals (e.g., gate to drain, gate to source, gate to bulk, or source to drain) of a transistor that allow the transistor to meet lifetime reliability specifications, and/or the set of voltage differentials between different terminals of a transistor within which the transistor may be biased without damaging the transistor. For example, in order to stay in the SOA, the gate-to-drain voltage of some transistors may not exceed 3.6V. Great care must be taken by circuit designers to control the application of HV signals in a NVM device to keep the transistors in the SOA and avoid transistor damage.

Some NVM arrays may use dedicated source line (DSL) architecture. DSL architecture may include dedicated source lines for each column of NVM cells in an NVM array (or each column of NVM cells in an NVM sector of an NVM array). Common source line (CSL) architecture allows for shared source lines between multiple rows and/or columns of NVM cells. For example, CSL architecture may share a CSL between substantially all the NVM cells in a sector of NVM cells. In other examples, CSL architecture may share a CSL between substantially all the NVM cells in an NVM array, or one or more rows and/or two or more columns of NVM cells in an NVM sector or array. The implementation of CSL architecture allows for a reduction of silicon area used for each memory cell. Designers implementing CSL architecture in a memory device may need to take additional care to control the application of high voltage signals and to maintain the SOA of the transistors.

The present disclosure addresses the above-mentioned and other deficiencies controlling the high voltage signals applied to a NVM device implementing CSL architecture.

In one embodiment, an NVM cell is coupled to a CSL shared with NVM cells of a sector. An NVM cell may be a unit of memory capable of storing a single data value (e.g. a single bit, such as a logical "0" or logical "1"). A sector or NVM sector may be a block of a NVM array containing multiple of NVM cells (i.e., multiple rows of NVM cells and multiple columns of NVM cells). A memory array may include one or more sectors. A high voltage control circuit controls multiple voltage signals, including HV signals and low voltage (LV) signals, for operation (e.g., pre-program operation, erase operation, program operation, or read operation) of the NVM cell while maintaining the SOA of transistors of the NVM device.

FIG. 1 is a block diagram illustrating a non-volatile memory system, according to an embodiment. NVM system 100 may include a processing device 104 coupled to NVM device 102 via address bus 106, data bus 108, and control bus 110. It will be appreciated by those skilled in the art that the NVM system 100 has been simplified for the purpose of illustration, and not intended to be a complete description. In particular, details of the processing device 104, row decoder 114, column decoder 118, sense amplifiers 122, and command and control circuitry 124, are not described in detail herein. It should be appreciated that NVM system 100 may include all, some, or more components than illustrated in FIG. 1.

External power supply 150, also referred to as power supply, is coupled to NVM device 102. External power supply 150 may be a power supply external to NVM device 102 and may be used by NVM device 102 to generate HV signals that are above the highest voltage of the external power supply 150 or below a lowest voltage of the external power supply 150 (e.g., ground voltage). For example, external power supply 150 may supply voltages from 0V to 1.2V. The HV signals may be below 0V or above 1.2V. For purpose of illustration, and not limitation, the following figures will be described as having an external power supply voltage of 0V to 1.2V, unless otherwise stated. It should be appreciated that different power supply voltage ranges may also be provided, for example 0V to 3V.

Processing device 104 may reside on a common carrier substrate such as, for example, an integrated circuit ("IC") die substrate, a multi-chip module substrate, or the like. Alternatively, the components of processing device 104 may be one or more separate integrated circuits and/or discrete components. In one exemplary embodiment, processing device 104 is the Programmable System on a Chip (PSoC®) processing device, developed by Cypress Semiconductor Corporation, San Jose, Calif. Alternatively, processing device 104 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

NVM device 102 includes memory array 112, such as NVM array, organized as rows and columns of non-volatile memory cells (not shown in this figure) as described below. Memory array 112 is coupled to row decoder 114 and/or command and control circuitry 124 via multiple select lines and read lines (at least one select line and one read line for each row of the memory array). Memory array 112 is further coupled to column decoder 118 via multiple bit lines 120 (one each for each column of the memory array). It will be appreciated that CSLs may be implemented as part of the multiple select lines and read lines and/or the multiple bit lines. Memory array 112 may be coupled to multiple sense amplifiers 122, via column decoder 118, to read multi-bit words therefrom. NVM device 102 further includes command and control circuitry 124 to receive signals from processing device 104 and sends signals to row decoder 114, control column decoder 118, sense amplifiers 122, control sector select circuit 140, and control HV signals applied to memory array 112. Command and control circuitry 124 includes high voltage control circuitry 126 to generate and control the HV signals for operation of NVM device 102, which may be routed through high voltage control circuitry 126 to column decoder 118, sense amplifiers 122, and/or sector selector circuit 140. High voltage control circuitry 126 operates to apply appropriate voltages, including HV signals and LV signals, to the memory cells during pre-program, erase, program, and read operations.

Command and control circuitry 124 may be configured to select a first row of memory array 112 for a program operation by applying a voltage to a first select line in the first row and to deselect a second row of the memory array by applying another voltage to a second select line in the second row. Command and control circuitry 124 may be further configured to control column decoder 118 to select a memory cell in the first row for programming by applying a voltage to a first bit line in a first column, and to inhibit an unselected memory cell in the first row from programming by applying another voltage to a second bit line in a second column. Command and control circuitry 124, in particular high voltage control circuitry 126, may be further configured to apply a voltage to one or more common source lines that may be coupled to memory cells included in memory cell array 112 as described below.

NVM device 102 may be a storage device configured to store data values in various low-power and non-volatile contexts. For example, NVM device 102 may be included in a small area flash memory which may be implemented in devices or systems such as smart cards or bank cards. Accordingly, memory devices as disclosed herein, such as NVM device 102, may be implemented to have a relatively small area which may be fabricated using advanced processing nodes, such as a 65 nm node or lower. Moreover, as discussed in greater detail below, NVM device 102 may include various memory cells (not shown) configured to store data values. The memory cells may be implemented with a common source line to reduce the overall footprint of each memory cell. Each memory cell may also be compatible with Fowler-Nordheim programming techniques.

Memory array 112 may include one or more NVM sectors, such as sector A 131 though sector N 132. Each sector may have any number of rows and columns of NVM cells, for example 4096 columns and 256 rows. Rows may include multiple NVM cells arranged horizontally. Columns may include multiple NVM cells arranged vertically. Memory array 112 may use a global bit line (GBL) shared by all the sectors of memory array 112. Each column of memory array 112 may have a GBL. For example, a particular GBL for column 0 shared by all of the sectors (e.g., sector A 131 through sector N 132) will be coupled to each row of memory array 112 in column 0 of all the sectors. The GBL is configured to provide HV signals to the sectors of memory array 112 during program operations and erase operation, but not during read operations.

Memory array 112 may use sector select circuit 140 to couple GBL to an associated bit line (BL) of a column of a particular sector. Each column in a sector may have an associated BL particular to that sector that is not shared by other sectors. Each column in a sector may have a sector select circuit 140 to selectively couple the GBL to the associated BL. For example, a sector select circuit 140 for column 0 of sector A 131 may be used as a switch to couple the voltage signal on GBL of column 0 of memory array 112 to the BL for column 0 of sector A 131 during erase operations and program operations.

Memory array 112 may also use sector select circuit 140 to couple a column of NVM cells in a sector to sense amplifiers 122 during a read operation. For example, a sector select circuit 140 for column 0 of sector A 131 may be used as a switch to couple the NVM cells of column 0 of sector A to sense amplifiers 122 during a read operation.

It should be appreciated that terms "rows" and "columns" of a memory array are used for purposes of illustration, rather than limitation. In one embodiment, rows are conventionally arranged horizontally and columns are conventionally arranged vertically. In another embodiment, rows and columns of memory array 112 may be arranged in any orientation.

In one embodiment, a NVM cell may be a two transistor (2T) memory cell. In a 2T memory cell, one transistor may be a memory transistor, while another transistor may be a pass transistor. In other implementations the NVM cell may include another number of transistors, such as a single memory transistor (1T). NVM cells, such as NVM cell 201 and 204 of FIG. 2A, will be discussed below in regards to at least FIG. 2A-4B.

Memory array 112 may be implemented using charge trapping memory transistors. Charge trapping memory transistors may be implemented to utilize transistors and gate structures that include a charge trapping layer. The charge trapping layer may be an insulator that is used to trap charge. The charge trapping layer may be programmed to store data based on voltages applied to or received by the memory array 112. In this way, a memory array 112 may include various different NVM cells arranged in rows and columns, and each NVM cell may be capable of storing at least one data value (e.g., bit). Voltages may be applied to each of the NVM cells to program the NVM cell (e.g., program operation—store a logic "1"), erase the NVM cell (e.g., erase operation—store a logic "0"), or read the NVM cell (e.g., read operation).

In one embodiment, the charge trapping memory transistors may be implemented using different materials. One example of a charge trapping memory transistor is a silicon-oxide-nitride-oxide-silicon (SONOS) type transistor. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to NVM cell. In another embodiment, different types of charge trapping memory transistors may be used. For purposes of illustration, and not limitation, the operation of NVM cells in the disclosure will be described with respect to a SONOS type transistor. It should be appreciated that other types of NVM transistors may be implemented using the disclosure herein.

FIG. 2A illustrates a selected sector of a non-volatile memory array during an erase operation, according to one embodiment. NVM sector 200 illustrates the various bias voltage levels applied to a selected sector during an erase operation. A selected sector may be a sector of a memory array selected for a particular operation, in this case for an erase operation. During an erase operation, one or more rows of NVM cells of a sector may be erased to read a logical "0". Also during an erase operation, one or more rows of NVM cells of a selected sector may not be erased (e.g., deselected row of selected sector).

NVM sector 200 contains two rows, a first row containing NVM cell 201 and a second row containing NVM cell 204. NVM sector 200 contains one column. NVM sector 200 also contains sector select circuit 140 for the column. Each column of a multi-column NVM sector may have a sector select circuit. Sector select circuit 140 includes three transistors 241, 242, 243. It should be appreciated that for purposes of illustration, and not for limitation, NVM sector 200 is shown with two rows and one column. An NVM sector may include the same, more, or less rows and the same or more columns than illustrated in FIG. 2A. It should also be appreciated that for purposes of illustration, and not for limitation, sector select circuit 140 is shown as part of an NVM sector 200. In another example, sector select circuit 140 may not be part of NVM sector 200.

NVM sector 200 illustrates multiple horizontal (row) signal lines and multiple vertical (column) signal lines. Horizontal signal lines include lines 230 (PSB), 231 (WLS), 232 (WL), 233 (WLS), 234 (WL), 235 (NS), 236 (CL), and 237 (Y). Vertical signal lines include 238 (BL) and 239 (GBL). Another signal line, the common source line (CSL) 240, is shared by all the NVM cells in NVM sector 200, including NVM cell 201 and NVM 204 and additional columns and rows of NVM cells (not shown) of the NVM sector 200. Substrate lines 270 (SPW), 271 (SPW), 273 (ANW) and 274 (NPW) may be coupled to a well, such as a P-well or an N-well. A well may be a material doped with p-type and/or n-type ions. A well may be isolated from the substrate (also referred to as the bulk). For example, the substrate lines may be coupled to a P-well of a transistor. In another embodiment, the substrate lines may be coupled to the substrate (which may be a coupling to the substrate or a well). It should be appreciated that the voltages applied to the signal lines, as illustrated in FIG. 2A through FIG. 5, may be electrically coupled to, applied by, controlled by, and/or sourced by high voltage control circuitry 126 of FIG. 1.

For purposes of illustration, and not for limitation, the external power supply of NVM sector 200 is 0V to 1.2V. The high voltage rail (i.e., 1.2V) may vary from 0.9V to 1.32V under certain conditions. It should be appreciated that the external power supply 150 of the NVM sector 200 may be any voltage range or may be dependent on the particular technology node. Also as illustrated, multiple HV signals may be applied to NVM sector 200 to perform the erase operation. For example, WLS 231 is at −3.6V, CSL 240 at 4.7V, BL is at 4.7V, SPW is at 4.7V, etc. It should be appreciated that high voltage control circuitry 126 controls the application of the various HV signals (and LV signals) so as to keep the transistors of the NVM sector 200 in SOA.

NVM sector 200 includes multiple transistors. The transistor of NVM sector 200 may be 4-terminal transistors including a gate, source, drain, and bulk (or well). NVM cell 201 and NVM cell 204 are 2T memory cells including a pass transistor (i.e., 202 and 205) and a memory transistor (203 and 206). Pass transistors 202 and 205 may be N-channel metal oxide semiconductor field-effect transistors (nMOSFET) where the source of the pass transistors is coupled to CSL 240.

The memory transistors 203 and 206 may be NVM transistors, such as charge trapping memory transistors. Memory transistors 203 and 206 are illustrated having a shaded oxide layer as the gate. The drains of memory transistors 203 and 206 are coupled to BL 238. In order to perform operations, such as erase and program, the SOA of memory transistors is typically much higher than other transistors in a memory array and are not often of great concern to designers. The pass transistors, such as pass transistors 202 and 205, and the transistors of sector select circuit 140 usually of a lower SOA than the memory transistors. The HV signals used for the operation of the memory transistors may exceed the SOA for at least the aforementioned transistors.

Sector select circuit 140 includes three transistors. Transistor 241 is P-channel metal oxide semiconductor field-effect transistor (pMOSFET) where the drain is coupled to GBL 239 and the source is coupled to BL 238. Transistor 242 is an nMOSFET where the drain is coupled to GBL 239 and where the source is coupled to BL 238. Transistor 243 is an nMOSFET where the drain is coupled to BL 238, the gate is coupled to Y 237, and where the source is coupled to CL 236. During an erase operation of a selected sector, transistor 241 of sector select circuit 140 is switched to on so that the voltage signal on GBL 239 is coupled to BL 238.

In one embodiment, the transistors of sector select circuit 140 are extended drain transistors. Extended drain transistors have an additional implant (either an N-type dopant for an nMOSFET or a P-type dopant for pMOSFET) in the drain, making the drain longer and the transistor no longer symmetrical. Extended drain transistors may be illustrated by having a rectangle located in the drain of the transistor, as illustrated in FIG. 2A. An extended drain transistor may be able to withstand a higher voltage differential (than a non-extended drain transistor) between the terminals of extended drain transistor, when the transistor is off. For example, an extended drain 5V transistor (DE5) or an extended drain 9V transistor (DE9) may withstand voltages of 5V or 9V, respectively, between the drain and source, the gate and drain, but not between the gate and source. A MOSFET without an extended drain, such as pass transistor 202 and 205, may only be able to withstand a voltage differential of roughly 3.6V between any of the transistor's terminals, for example. An extended drain transistor may have a higher SOA when off because the extended drain transistor may be able to withstand higher voltage differentials across particular terminals, as described above. However when turned on, the extended drain transistor may have an SOA with lower voltage differentials (e.g., 3.6V).

In another embodiment, one or more of the transistors of sector select circuit 140 may be implemented using cascoded transistors biased to protect the circuit for overvoltage stress while maintaining SOA. In still another embodiment, the transistors of sector select circuit 140 may be implemented using transistors using a thicker gate oxide capable of supporting high direct voltages, such as 4.7V. Transistors using a thicker gate oxide may be implemented with a process using a third gate oxide.

During an erase operation to erase a memory cell of a row of a selected sector, an HV signal of 4.7V is applied to CSL 240 by high voltage control circuitry 126. The HV signal of 4.7V is above the 1.2V high-rail of the power supply, such as external power supply 150. Also during the erase operation, the gate of memory transistor 203 is coupled to WLS and a voltage potential of −3.6V, which is below the 0V low-rail of the power supply. The voltage differential between the gate relative the bulk of memory transistor 203 is at a −8.3V, which causes holes to be injected from the channel into the charge trapping layer of memory transistor 203. The erase of memory transistor 203 causes memory cell 201 to read a logical "0." During the erase operation, NVM cell 204 is not erased as the row has been deselected and the voltage between the gate and bulk of memory transistor 206 is 0V.

It should be appreciated that some of the different voltage levels and electrical connections illustrated in FIGS. 2A through 4B may not be described herein. A person of reasonable skill in the art would be able to determine the different voltage levels and electrical connections in view of the Figures herein, in particular FIG. 2A through FIG. 5. Further, it should also be appreciated that, apart from the relative voltage levels of different signal lines, the description with respect to FIG. 2A applies to FIGS. 2B through 4B, unless otherwise described.

FIG. 2B illustrates a deselected sector of a non-volatile memory array during an erase operation, according to one embodiment. During an erase operation on a deselected sector, the NVM memory cells of the deselected sector are not erased. As illustrated, the voltage differential between the gate to bulk, gate to drain and gate to source for memory transistor 203 and 206 are at 0V, which does not materially alter the charge distribution in the charge trapping layer of the memory transistor 203 and 206.

FIG. 3A illustrates a selected sector of a non-volatile memory array during a program operation, according to one embodiment. During a program operation on a selected sector 300, one or more NVM cells of a selected row may be programmed to a logical "1" while the remaining NVM cells on the selected row may be inhibited from being programmed and remain erased. The NVM cells of deselected rows may be prevented from changing previously stored data values. A write operation may include both an erase operation and a program operation.

In NVM sector 300, NVM cell 201 is illustrated as being a selected row and being programmed or inhibited during a program operation. During programming mode, to program NVM cell 201, sector select circuit 140 controls the voltage on BL 238 to be −3.6V. During programming mode, to inhibit NVM cell 201, sector select circuit 140 controls the voltage of BL 238 to be 1.2V. Inhibit refers to preventing an erased NVM cell (e.g., logical "0") from becoming programmed (e.g., logical "1") during a program operation. NVM cell 204 is illustrated as being a deselected row during a program operation.

During a program operation to program NVM cell 201, an HV signal of 4.7V is applied to WLS 231 which is coupled to the gate of memory transistor 203. GBL 239 is coupled to HV signal of −3.6V and transistor 242 of sector select circuit 140 turns on to couple the −3.6V on the GLB 239 to BL 238. The voltage across the gate relative the bulk and drain of memory transistor 203 is 8.3V. The 8.3V differential injects electrons from the channel of memory transistor 203 into the charge trapping layer which causes memory transistor 203 to be programmed to a logical "1." Also during the program operation to program NVM cell 201, an HV signal of −3.6V is applied to WL 232 which is coupled to the gate of pass transistor 202. An HV signal of −2.4V is applied to CSL 240 which is coupled to the source of pass transistor 202.

During the program operation, NVM cell 201 may be inhibited rather than programmed. To inhibit NVM cell 201 during a program operation, sector select circuit 140 opens (i.e., transistor 241 is turned on) which couples a voltage signal of 1.2V from GBL 239 to BL 238. It should be appreciated that high voltage control circuitry 126 applies the either −3.6V or 1.2V to GBL 239 dependent on the determination of whether to program or inhibit NVM cell 201.

FIG. 3B illustrates a deselected sector of a non-volatile memory array during a program operation, according to another embodiment. During program operation on a deselected sector, the NMV memory cells of the deselected sector are not programmed and the data values remain unchanged. As illustrated, the voltage differentials between the gate and bulk of memory transistor 203 and 206 are at 0V, which does not materially alter the charge distribution in the charge trapping layer of the memory transistor 203 and 206.

FIG. 4A illustrates a selected sector of a non-volatile memory array during a read operation, according to one embodiment. During a read operation of a selected sector, the logical values of one or more NVM cells may be read. During a read operation of a selected sector, the gates of the memory transistors 203 and 206 may be grounded. An erased memory transistor may have a current flow during the read operation. The current is sensed by sense amplifiers 122, which registers a logical "0" for the particular NVM cell. A programmed transistor has substantially no current flowing during a read operation. Sense amplifiers 122 will sense substantially no current from the programmed NVM cell and register a logical "1" for the particular NVM cell.

During the read operation of NVM cell 201, an HV signal of 2.5V may be applied to WL 232 and coupled to the gate of pass transistor 202, while 0V may be applied to CSL 240. 0V may also be applied to WLS 231 coupled to the gate of memory transistor 203. Sector select circuit 140 turns on transistor 243, by applying an HV signal of 2.5V to signal line Y 237. Transistor 243 opens which allows current to flow to CL 236 and be sensed by sense amplifiers 122. Voltage on BL 238 may fluctuate from 0V to 0.6V, depending on whether the read NVM cell is a logical "0" or "1."

FIG. 4B illustrates a deselected sector of a non-volatile memory array during a read operation, according to another embodiment. No NVM cells are read from a deselected sector during a read operation.

FIG. 5 are tables illustrating voltage biases for erase, program, and read operations performed on a non-volatile memory device, according to one embodiment. Table 501 illustrates the row-based voltage signals and the associated signal lines for memory array 112 using CSL architecture. Table 501 provides the voltage signals for different operations, such as an erase operation, program operation, and read operation, to be provided to a selected row of a selected sector, a deselected row of a selected sector, and the rows of a deselected sector. Table 502 illustrates column-based voltage signals and the associated signal lines for memory array 112 using CSL architecture. Table 502 provides the voltage signals for different operations, such as an erase operation, program operation, and read operation. In regards to an erase operation, table 502 proves voltage signals for columns of a selected sector and deselected sector. In regards to a program operation, table 502 provides voltage signals for a column of a selected sector that is to be programmed or inhibited, and a column of a deselected sector. In regards to a read operation, table 502 provides voltage signals for a selected column of a selected sector, a deselected column of a selected sector, and columns of a deselected sector. Table 503 illustrates the various voltage ranges of the voltage signals provided in the preceding tables. Vpwr represents the voltage of the power supply, such as the positive rail of external power supply 150. VLO may swing from 0V to Vpwr when another voltage signal, such as VPOS exceeds a threshold voltage, such as 3V. VHI may swing from Vpwr to 0V when another voltage signal, such as VNEG, is decreases to below a threshold voltage, such as −2V. The shifting of VLO and/or VHI, also referred to as two rail level shifting, may help keep the transistors of NVM device 102 in SOA. It should be appreciated that the voltage ranges are provided for illustration, rather than limitation, and that different voltage ranges be used. In addition, tables 501, 502, 503 illustrate a table form of at least some of the voltage signals illustrated with respect FIGS. 2A through 4A.

Figure 6:
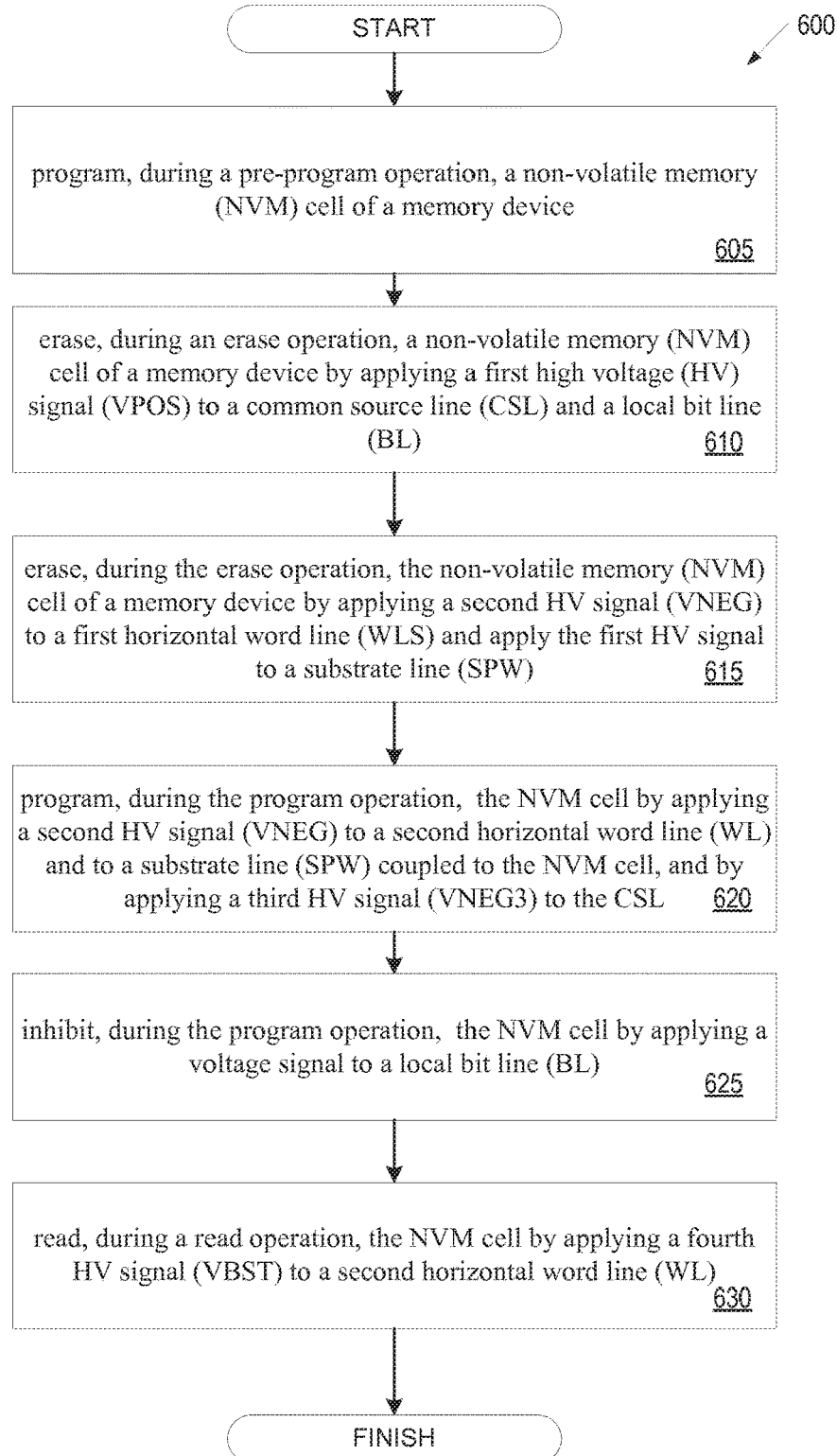
FIG. 6 is a flow diagram illustrating different operations performed on an non-volatile memory cell, according to an embodiment.

FIG. 6 is a flow diagram illustrating different operations performed on an non-volatile memory cell, according to an embodiment. The operations may include a pre-program, an erase operation, a program operation, and a read operation. It should be appreciated that only some of the voltage signals are described for each operation. Additional voltage signals for each operation are described in regards to FIG. 2A through FIG. 5. Method 600 may be performed by processing logic that comprises hardware (e.g., circuitry, dedicated logic, programmable logic, microcode), software (e.g., instructions run on a processing device to perform hardware simulation), or a combination thereof. In one embodiment, processing device 104 and/or part or all of non-volatile memory device 102, such as/high voltage control circuitry 126, as shown in FIG. 1 may perform some or all the operations described herein.

Method 600 begins at block 605 where processing logic performing the method programs, during a pre-program operation, the NVM cell 201. A pre-programming operation programs all the NVM cells in a row to a logical "1." Programming, during a programming operation may program some NVM cells in a row to a logical "1," while inhibiting other NVM cells in the same row from changing value. The programming during a pre-program operation (also referred to as soft-programming) uses the same HV and LV voltage signals as a program during a program operation as illustrated in FIGS. 3A, 3B, and 5. The duration of a soft-program (e.g., the duration of the application of HV and LV signals) may be significantly less than the duration of a program during a program operation. For example, a soft-program may be roughly 0.3 ms while a program may be 2 ms. Although both a soft-program and a program increase the threshold voltage (Vt) of the memory transistor of a NVM cell, a soft-program changes the threshold voltage (Vt) of a memory transistor less than a program of a program operation. In some embodiments, a pre-program operation prior to an erase operation enhances the reliability of NVM cells.

Method 600 continues to block 610 where processing logic erases, during an erase operation, the NVM cell 201 by applying a first HV signal (VPOS) to the CSL 240. Processing logic also applies the first HV signal (VPOS) to the BL 238. The first HV signal is above a highest voltage of the power supply 150. CSL 240 may be biased at 4.7V.

Method 600 continues to block 615 where processing logic erases, during an erase operation, the NVM cell 201 by applying a second HV signal (VNEG) to a first horizontal word line (WLS 231) coupled to the NVM cell 201. WLS 231 may be biased at −3.6V. Processing logic also applies the first HV signal (VPOS) to the substrate line (SPW). SPW may be biased with an HV signal of 4.7V.

Method 600 continues to block 620 where processing logic programs, during a program operation, a non-volatile memory (NVM) cell 201 of a NVM device 102 by applying a second high voltage (HV) signal (VNEG) to a second horizontal word line (WL 232) and substrate line (SPW) coupled to the NVM cell 201. The second HV signal (VNEG) is below a lowest voltage of a power supply 150 (e.g., ground supply) of the NVM device 102. WL 232 and SPW 270 may be biased at −3.6V while the power supply 150 ranges from 0V to 1.2V. Processing logic also applies a third HV signal (VNEG3) to the CSL 240. CSL 240 may be biased around −2.4V. The CSL 240 is shared among NVM cells of a sector 300 of NVM cells.

Method 600 continues to block 625 were processing logic inhibits, during the program operation, the NVM cell 201 of the sector 300 of NVM cells by applying a voltage signal (VBL) to a local bit line (BL 238). The voltage signal (e.g., LV signal) is within a voltage range of the power supply 150 and may be approximately 1.2V. It should be noted that if NVM cell 201 is to be programmed during the program operation, BL 238 is biased with an HV signal of −3.6V and SPW is biased with an HV signal of −3.6V.

Method 600 continues to block 630 where processing logic reads, during a read operation, the NVM cell 201 by applying a fourth HV signal (VBST) to WL 232. The fourth HV signal is above a highest voltage of the power supply 150 and may be biased at 2.5V.

Figure 7:
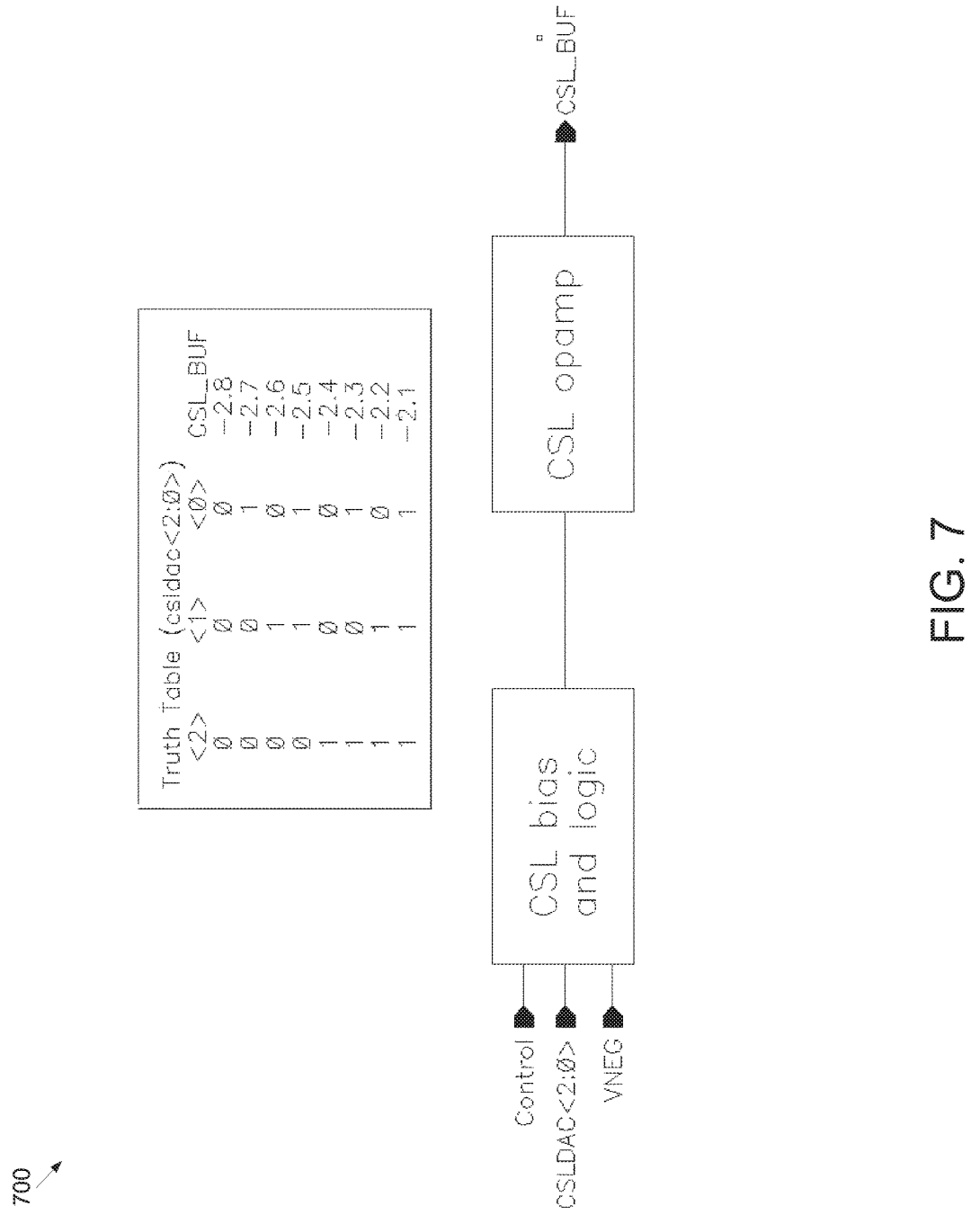
FIG. 7 is a circuit schematic of common source line driver, according to an embodiment.

FIG. 7 is a circuit schematic of common source line driver, according to an embodiment. Circuit 700 illustrates a CSL driver used to bias CSL 240 in memory array 112 using CSL architecture. In one embodiment when using the CSL architecture, the CSL 240 is biased at a voltage higher than VNEG (e.g., −3.6V to −2.4V) to reduce the subthreshold leakage through the pass transistor of inhibited cells during a program operation. The inhibited cells during a program operation are coupled to signal lines with the following voltages, BL=1.2V and WLS=4.7V. To address the aforementioned, 700 was designed to use VNEG as the negative supply. Based on the logical value (e.g., csldac<2: 0>) setting, the output of the circuit CSL_BUF may be varied between −2.8V to −2.1V.

The voltage signal at CSL_BUF may be coupled to an additional HV multiplexor (not shown) which sends the voltage signal at CSL_BUF (e.g., VNEG3) during a program operation, VPOS during an erase operation, or Vgnd (e.g., 0V) during the read operation to the CSL 240 in the selected memory sector.

Figure 8:
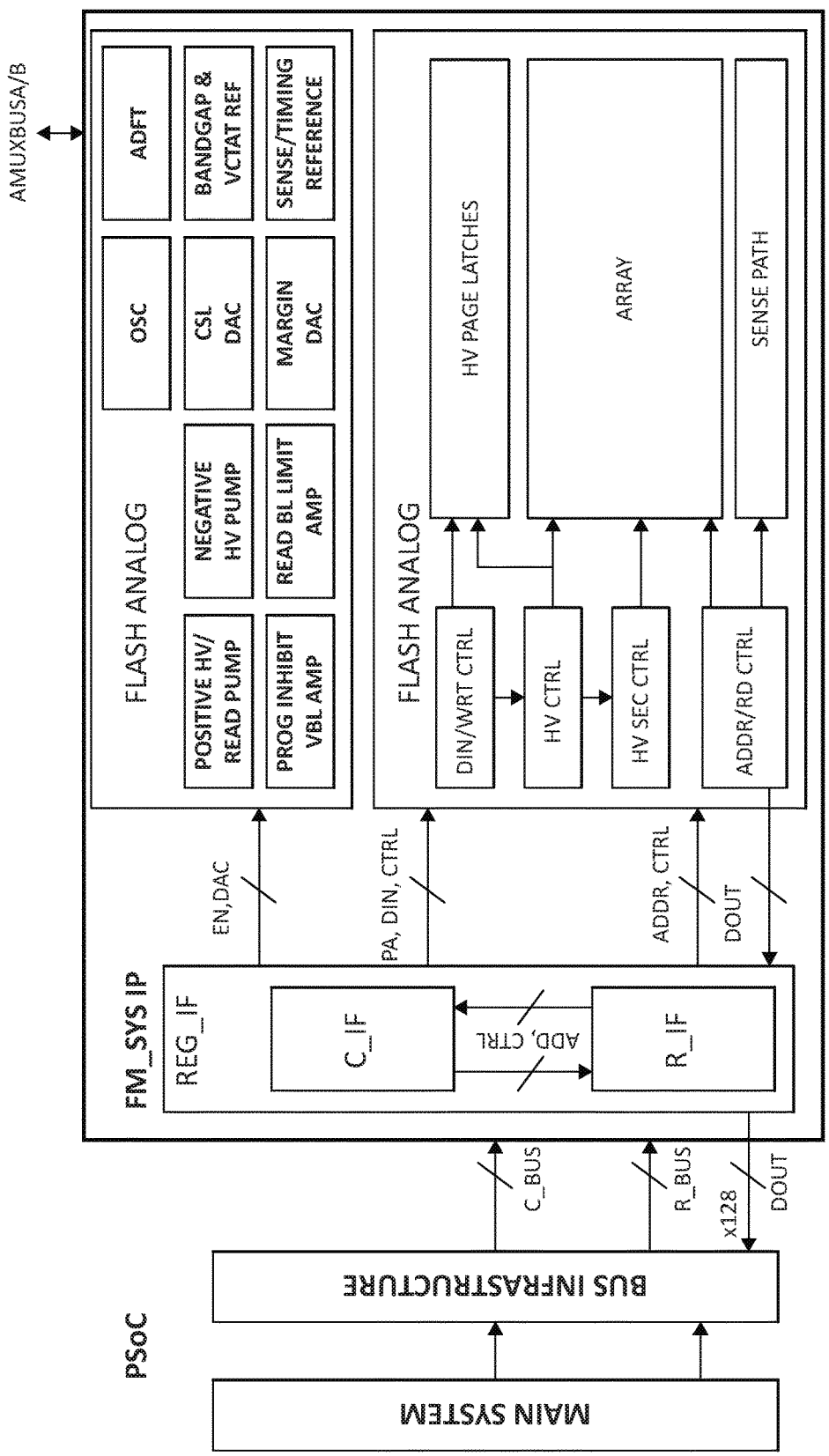
FIG. 8 is a circuit schematic of a word line driver, according to an embodiment.

FIG. 8 is a circuit schematic of a word line driver, according to an embodiment. Circuit 800 illustrates a word line (WL) driver circuit used in conjunction with NVM device 102 implementing CSL architecture. Circuit 800 uses a source section to partly decode low voltage (LV) (i.e., within the range of the power supply, e.g., 0V to 1.2V) and HV signals. The source section is followed by a distributed driver to achieve the required speed (<2 ns). In one embodiment of an NVM device using CSL architecture, the voltage signal at the output of the circuit 800 (which may be coupled to WL 232) is approximately at VNEG levels (e.g., −3.6V to −2.4V) during a program operation of the selected sector, which helps eliminate the leakage through the pass transistor 202.

Figure 9:
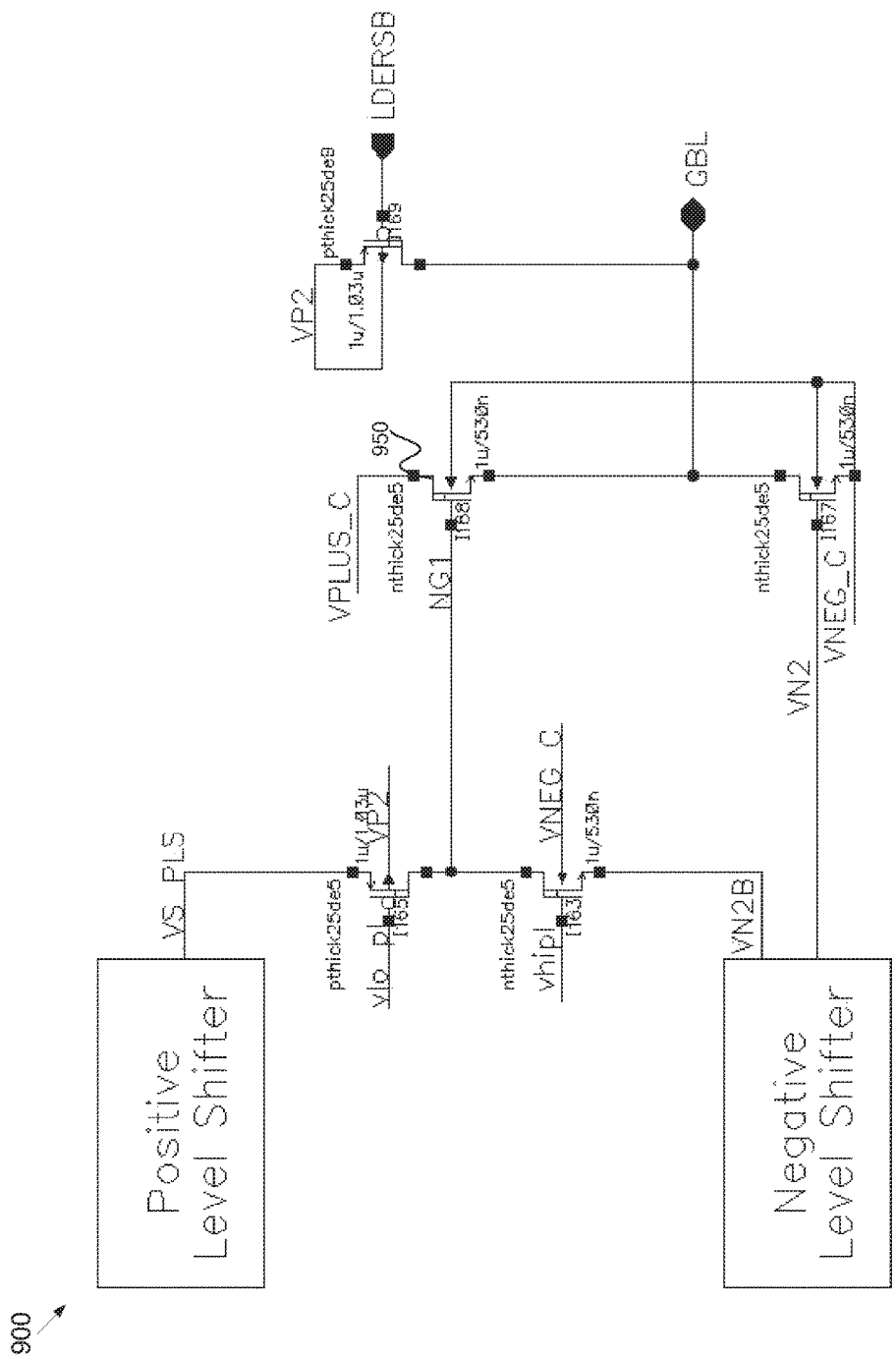
FIG. 9 is a s circuit schematic of a high voltage page latch, according to an embodiment.

FIG. 9 is a s circuit schematic of a high voltage page latch, according to an embodiment. In some embodiments of NVM device, the VBL voltage is bound within the range of power supply 150. For example, the minimum value for the positive-rail of power supply 150 is 1.08V, which is enough to protect against the bit line disturb mechanism for the inhibited columns during a program operation. Changing to smaller technology nodes, the voltage supply values also get smaller. In the 55 nm technology node, the minimum high-rail of power supply 150 may get as low as 0.9V, which may not be enough for VBL to protect against bit line disturb. Responsive to the reduction in the high-rail power supply voltage, a new voltage range for VBL from 0.5V to 1.2V may be used with a power supply ranging between 0.85-1.32V. Circuit 900 illustrates a high voltage page latch (HVPL) that allows the propagation of VBL which can be higher or lower than the high-rail of power supply 150.

Figure 10:
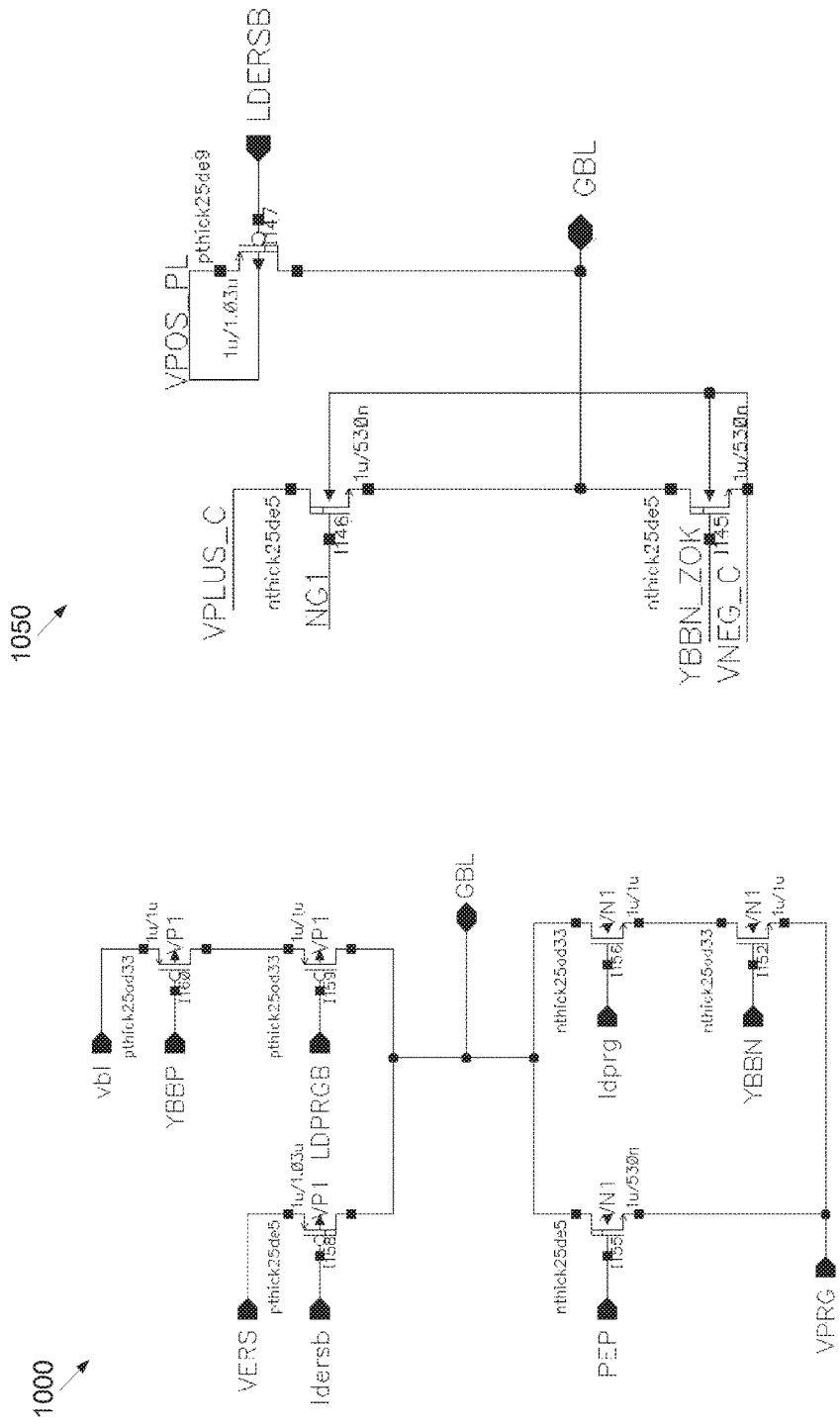
FIG. 10A is a circuit schematic of high voltage page latch, according to one embodiment.
FIG. 10B is a circuit schematic of high voltage page latch, according to another embodiment.

In circuit 900, the VBL voltage signal may be delivered through the NMOS transistor 950, the gate of which may be biased at VPOS level when VBL is passed onto the GBLs. Such a configuration may simplify the HV circuitry and reduce the number of transistors and different wells biased at VBL signal levels. A second change includes making the pre-program operation a regular program operation during which all HVPLs are loaded with Data=1. Such a change may allow for the reduction of the two branches needed for the negative voltage, to only one branch. FIGS. 10A and 10B are circuit schematics of high voltage page latches, according to one embodiment. Circuit 1000 is an HVPL with two branches, while circuit 1050 illustrates an HVPL with a single branch. FIG. 10B is a detailed illustration of the high voltage page latch of FIG. 9.

Figure 11:
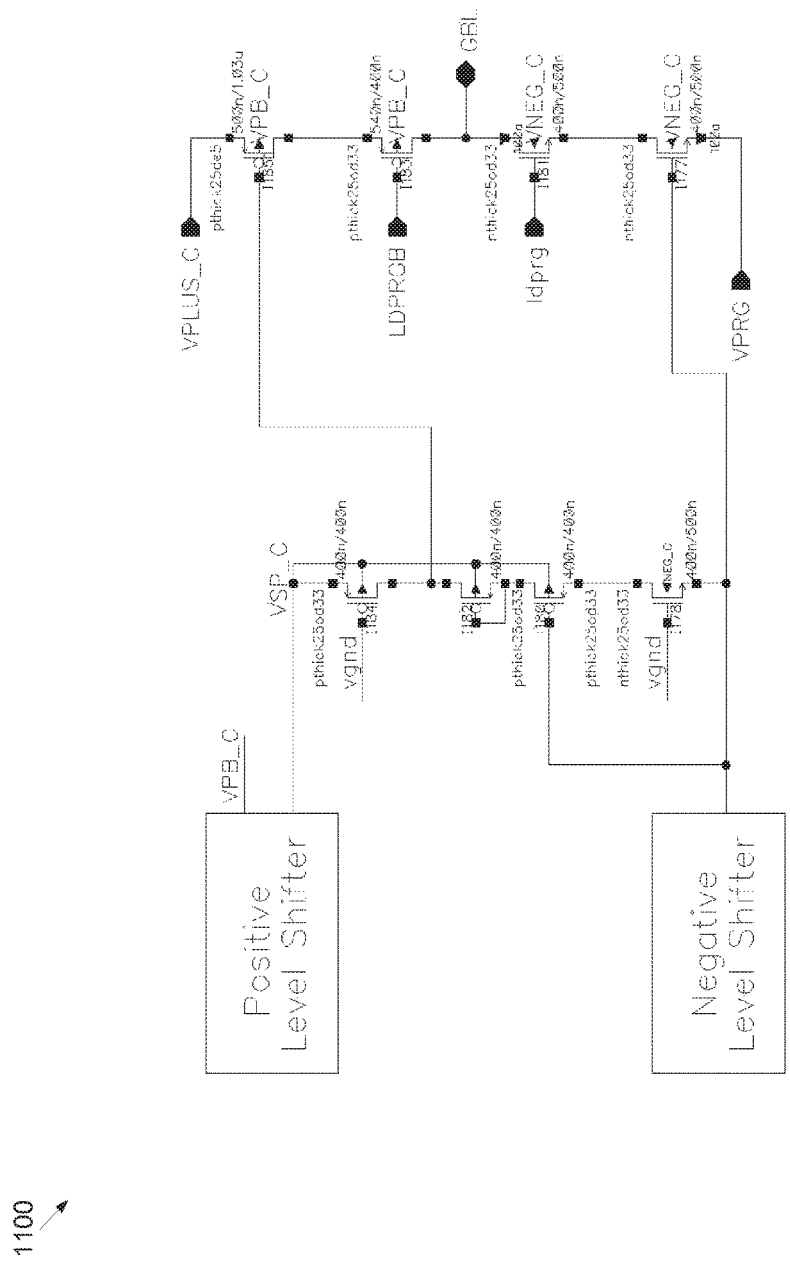
FIG. 11 illustrates a circuit schematic of a high voltage page latch, according to another embodiment.

FIG. 11 illustrates a circuit schematic of a high voltage page latch, according to another embodiment. Circuit 1100 illustrates an alternative implementation of an HVPL.

Figure 12:
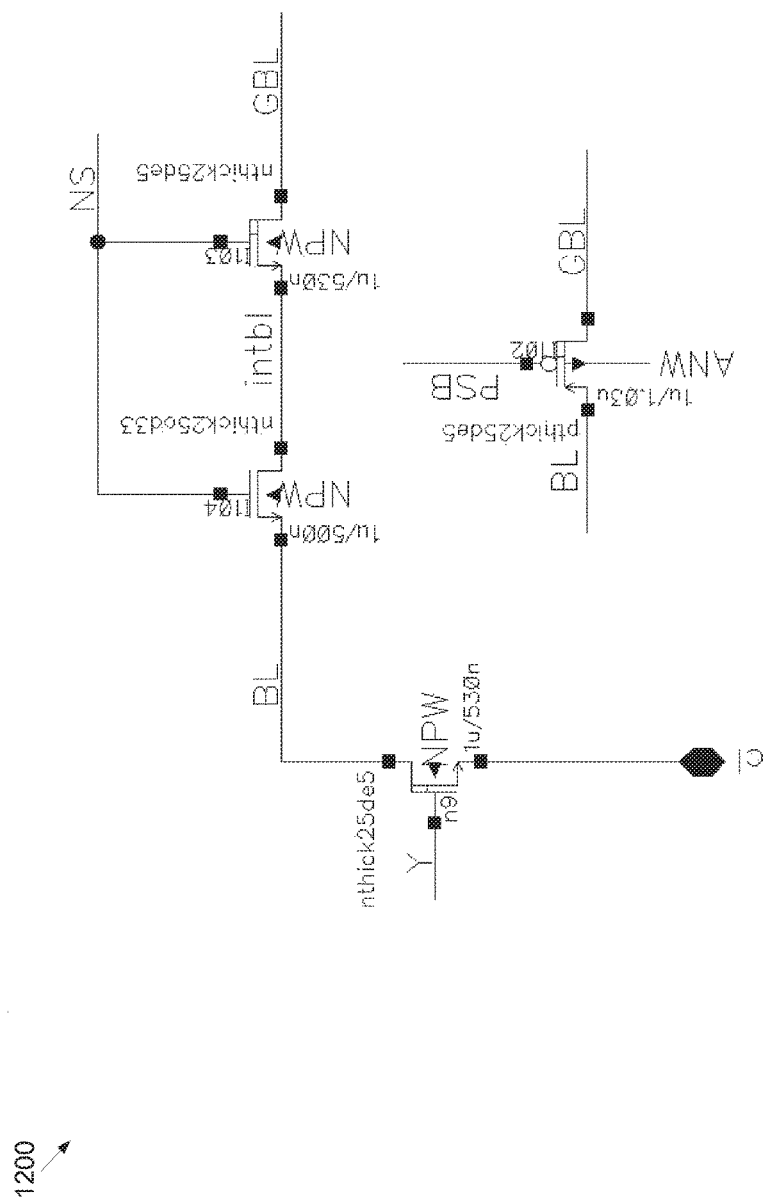
FIG. 12 illustrates a circuit schematic of a sector select circuit, according to another embodiment.

FIG. 12 illustrates a circuit schematic of a sector select circuit, according to another embodiment. Circuit 1200 illustrates an alternative implementation of a sector select circuit. In circuit 1200, a larger equivalent transistor may be used to connect between BL and CL. The larger equivalent transistor may improve read time. NMOS device 1104 may be added to reduce BL to GBL leakage from unselected sectors. Such an implementation may minimize current delivered by a negative charge pump, which may result in a smaller silicon area.

Figure 13:
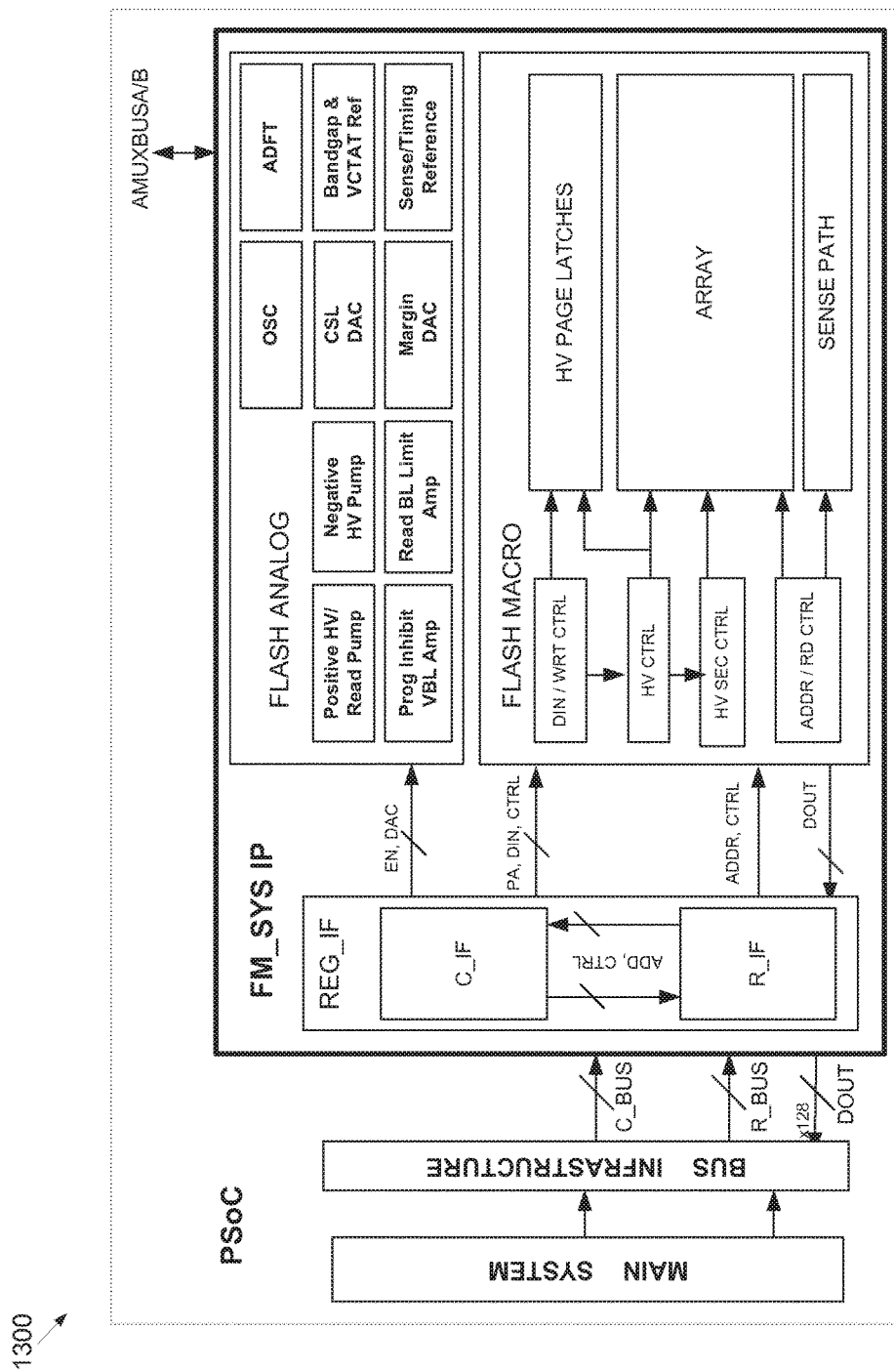
FIG. 13 is a block diagram illustrating a non-volatile memory system, according to another embodiment.

FIG. 13 is a block diagram illustrating a non-volatile memory system, according to another embodiment. Circuit 1300 is another NVM system in which the current disclosure may operate.

Embodiments of the present invention include various operations described herein. These operations may be performed by hardware components, software, firmware, or a combination thereof.

Certain embodiments may be implemented as a computer program product that may include instructions stored on a non-transitory machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A method comprising:
applying, during an erase operation, a first high voltage signal (VPOS) to a common source line (CSL) and bit line (BL), wherein the CSL and BL are coupled to a non-volatile memory (NVM) cell of a first row of NVM cells of a memory device, wherein the CSL is shared among the NVM cell and one or more other NVM cells of the first row of NVM cells in a direction of the first row;
applying, during a program operation, a second high voltage signal (VNEG) to a word line (WL) and to a substrate line (SPW), wherein the WL and SPW are coupled to the NVM cell; and
applying a third high voltage signal to the CSL during the program operation, wherein the first high voltage signal is above a highest voltage of a power supply, wherein the second high voltage signal is below a lowest voltage of a ground supply of the memory device, and wherein the third high voltage signal is different than the second high voltage signal.

2. The method of claim 1, further comprising applying a fourth high voltage signal to the word line during a read operation, wherein the fourth high voltage signal is above the highest voltage of the power supply.

3. The method of claim 1, wherein the common source line is shared between a plurality of rows of NVM cells in a NVM sector.

4. The method of claim 1, further comprising:
inhibiting, during the program operation, the NVM cell by applying a low voltage signal to the bit line, wherein the low voltage signal is within a voltage range of the power supply.

5. A system, comprising:
a plurality of non-volatile memory (NVM) cells in a sector, each of the plurality of NVM cells coupled to a common source line (CSL);
a local bit line (BL) coupled to at least one NVM cell of the plurality of NVM cells;
a word line (WL) coupled to the at least one NVM cell; and
a sector select circuit, coupled to a column of NVM cells in the sector, comprising at least one transistor disposed between the BL and a common line (CL), the sector select circuit to control a bit line voltage applied to the BL, the sector select circuit comprising:
a first N-channel metal oxide semiconductor field-effect transistor (nMOSFET) comprising a first gate, a first well, a first source, and first drain coupled to the local bit line;
a second nMOSFET comprising a second gate, a second well, a second drain, and second source coupled to the local bit line; and
a P-channel metal oxide semiconductor field-effect transistor (pMOSFET) comprising a third gate, a third well, a third drain, and third source coupled to the local bit line.

6. The system of claim 5, wherein the sector select circuit further comprises an NMOS device disposed between the local bit line and a global bit line (GBL) to reduce leakage from one or more unselected sectors.

7. The system of claim 5, further comprising:
a voltage control circuit that controls a plurality of high voltage (HV) signals for operation of at least one NVM cell while maintaining a safe operating area (SOA), wherein the plurality of high voltage signals are above a highest voltage of a power supply of or below a lowest voltage of a ground supply of a memory device, wherein the voltage control circuit applies;
a first high voltage signal (VPOS) to the common source line and local bit line during an erase operation to erase the NVM cell, wherein the first high voltage signal is above the highest voltage of the power supply; and
a second high voltage (HV) signal (VNEG) to the word line and to a substrate line (SPW) during a program operation to program the NVM cell, wherein the second high voltage signal is below the lowest voltage of the ground supply.

8. The system of claim 7, wherein the safe operating area is a set of voltage differentials between different terminals of a transistor within which the transistor may be biased without damaging the transistor.

9. A method comprising:
performing a pre-programming operation on an NVM cell coupled to at least one transistor disposed between a bit line and a common line (CL), the at least one transistor comprising:
a first N-channel metal oxide semiconductor field-effect transistor (nMOSFET) comprising a first gate, a first well, a first source, and first drain coupled to a local bit line;
a second nMOSFET comprising a second gate, a second well, a second drain, and second source coupled to the local bit line; and
a P-channel metal oxide semiconductor field-effect transistor (pMOSFET) comprising a third gate, a third well, a third drain, and third source coupled to the local bit line;
wherein performing the pre-programming operation on the NVM cell comprises: applying a first high voltage signal (VPOS) to a first word line (WLS) coupled to the NVM cell;
applying a second high voltage signal (VNEG) to a second word line (WL) and to a substrate line (SPW) coupled to the NVM cell; and
applying a third high voltage signal (VNEG3) to a common source line (CSL) coupled to the NVM cell, wherein the common source line is shared among NVM cells of a sector of NVM cells, and the first high voltage signal is above a highest voltage of a power supply of a memory device.

10. The method of claim 9, further comprising:
erasing, during an erase operation, the NVM cell, the erasing comprising:
applying the first high voltage signal to the common source line and the bit line (BL);
applying the second high voltage signal to the first word line; and
applying the first high voltage signal to the substrate line.

11. The method of claim 10, wherein pre-programing occurs prior to erasing.

12. The method of claim 9, wherein the second high voltage signal is below a lowest voltage of a ground supply of the memory device.

13. The method of claim 9, further comprising:
inhibiting, during a program operation, the NVM cell by applying a low voltage signal to the local bit line, wherein the low voltage signal is within a voltage range of the power supply.

14. The method of claim 9, further comprising:
reading, during a read operation, the NVM cell by applying a fourth high voltage signal (VBST) to the second word line (WL), wherein the fourth high voltage signal is above the highest voltage of the power supply.

15. The method of claim 9, wherein the NVM cell is a charge trapping memory cell.

16. The method of claim 9, wherein the NVM cell is a silicon oxide nitride oxide silicon (SONOS) memory cell.

17. The method of claim 9, wherein the common source line is shared between a plurality of rows of NVM cells and a plurality of columns of NVM cells of the sector.

18. The method of claim 9, wherein the first high voltage signal, the second high voltage signal, and the third high voltage signal are applied for less than one millisecond.

* * * * *